(12) United States Patent
Bangsaruntip et al.

(10) Patent No.: US 8,673,698 B2
(45) Date of Patent: Mar. 18, 2014

(54) GENERATION OF MULTIPLE DIAMETER NANOWIRE FIELD EFFECT TRANSISTORS

(75) Inventors: Sarunya Bangsaruntip, Mount Kisco, NY (US); Guy M. Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/610,223

(22) Filed: Sep. 11, 2012

(65) Prior Publication Data

US 2013/0017673 A1 Jan. 17, 2013

Related U.S. Application Data

(63) Continuation of application No. 12/778,526, filed on May 12, 2010.

(51) Int. Cl.
*H01L 21/00* (2006.01)
(52) U.S. Cl.
USPC .................................. 438/151; 257/E21.404
(58) Field of Classification Search
USPC ........... 438/151, 142; 977/762, 938; 257/347, 257/E29.246, E21.404
See application file for complete search history.

(56) References Cited

U.S. PATENT DOCUMENTS

| | | | |
|---|---|---|---|
| 5,872,378 A | 2/1999 | Rose et al. | |
| 6,181,193 B1 | 1/2001 | Coughlin, Jr. | |
| 6,207,588 B1 | 3/2001 | Choi et al. | |
| 6,340,625 B1 | 1/2002 | Choi et al. | |
| 6,362,606 B1 | 3/2002 | Dupuis et al. | |
| 6,392,488 B1 | 5/2002 | Dupuis et al. | |
| 6,500,728 B1 | 12/2002 | Wang | |
| 6,504,418 B1 | 1/2003 | Coughlin, Jr. | |
| 6,551,881 B1 | 4/2003 | Letavic | |
| 6,656,573 B2 | 12/2003 | Chen et al. | |
| 6,724,048 B2 | 4/2004 | Min et al. | |
| 6,821,913 B2 | 11/2004 | Chuang et al. | |
| 6,916,717 B2 | 7/2005 | Li et al. | |
| 6,951,792 B1 | 10/2005 | McElheny et al. | |
| 6,970,036 B2 | 11/2005 | Mizuno | |
| 7,129,554 B2 | 10/2006 | Lieber et al. | |
| 7,161,414 B2 | 1/2007 | Mizuno | |
| 7,211,464 B2 | 5/2007 | Lieber et al. | |
| 7,224,195 B2 | 5/2007 | Pilling et al. | |
| 7,224,232 B2 | 5/2007 | Paul et al. | |
| 7,254,151 B2 | 8/2007 | Lieber et al. | |
| 7,256,466 B2 | 8/2007 | Lieber et al. | |
| 7,416,927 B2 | 8/2008 | Gottsche et al. | |
| 7,528,004 B2 | 5/2009 | Torii | |
| 7,825,032 B2 | 11/2010 | Bakkers et al. | |
| 7,943,530 B2 | 5/2011 | Sekaric et al. | |
| 2003/0008505 A1 | 1/2003 | Chen et al. | |
| 2004/0166642 A1* | 8/2004 | Chen et al. ................... | 438/284 |

(Continued)

*Primary Examiner* — Yu-Hsi D Sun
(74) *Attorney, Agent, or Firm* — Cantor Colburn LLP; Vazken Alexanian

(57) ABSTRACT

A method of modifying a wafer having a semiconductor disposed on an insulator is provided and includes forming first and second nanowire channels connected at each end to semiconductor pads at first and second wafer regions, respectively, with second nanowire channel sidewalls being misaligned relative to a crystallographic plane of the semiconductor more than first nanowire channel sidewalls and displacing the semiconductor toward an alignment condition between the sidewalls and the crystallographic plane such that thickness differences between the first and second nanowire channels reflect the greater misalignment of the second nanowire channel sidewalls.

17 Claims, 3 Drawing Sheets

(56) References Cited

U.S. PATENT DOCUMENTS

| | | |
|---|---|---|
| 2004/0180478 A1 | 9/2004 | Yang et al. |
| 2007/0122998 A1 | 5/2007 | Droes et al. |
| 2007/0152276 A1* | 7/2007 | Arnold et al. ............ 257/369 |
| 2007/0187682 A1 | 8/2007 | Takeuchi et al. |
| 2008/0061284 A1 | 3/2008 | Chu et al. |
| 2008/0203468 A1 | 8/2008 | Cheng et al. |
| 2008/0206936 A1 | 8/2008 | Fernandez-Ceballos et al. |
| 2008/0211025 A1 | 9/2008 | Gottsche et al. |
| 2008/0213956 A1* | 9/2008 | Black et al. ............ 438/197 |
| 2008/0293246 A1 | 11/2008 | Cohen et al. |
| 2010/0193770 A1 | 8/2010 | Bangsaruntip et al. |
| 2011/0133280 A1 | 6/2011 | Bangsaruntip et al. |
| 2011/0278543 A1 | 11/2011 | Bangsaruntip et al. |
| 2011/0278544 A1 | 11/2011 | Bangsaruntip et al. |
| 2011/0316565 A1 | 12/2011 | Guo et al. |

\* cited by examiner

GENERATION OF MULTIPLE DIAMETER NANOWIRE FIELD EFFECT TRANSISTORS

CROSS REFERENCE TO RELATED APPLICATIONS

The present application is a continuation application of co-pending U.S. patent application Ser. No. 12/778,526, which was filed on May 12, 2010. The entire contents of co-pending U.S. patent application Ser. No. 12/778,526 are incorporated herein by reference.

BACKGROUND

Aspects of the present invention are directed to methods of generating of multiple diameter nanowire field effect transistors (FETs).

Nanowire FETs are attracting considerable attention as an option for the design of future complementary-metal-oxide-semiconductor (CMOS) components. While advances are being made, several key issues remain to be considered. Among these, one particular issue is that nanowire FET devices will be required to provide for devices with different drive current strengths and/or different threshold voltages (Vt).

While current solutions to the problem of providing for devices with different drive current strengths and/or different threshold voltages exist, the solutions generally rely upon modulations of device threshold voltages by way of corresponding modulations of the gate work-function. As such, these solutions tend to have relatively difficult and costly process integration operations and, additionally, the solutions tend to present variation concerns.

SUMMARY

In accordance with an aspect of the invention, a method of modifying a wafer having a semiconductor disposed on an insulator is provided and includes forming first and second nanowire channels connected at each end to semiconductor pads at first and second wafer regions, respectively, with second nanowire channel sidewalls being misaligned relative to a crystallographic plane of the semiconductor more than first nanowire channel sidewalls and displacing semiconductor material from the first and second nanowire channels toward an alignment condition between the sidewalls thereof and the crystallographic plane such that thickness differences between the first and second nanowire channels after the displacing reflect the greater misalignment of the second nanowire channel sidewalls.

In accordance with an aspect of the invention, a method of modifying a wafer having a semiconductor disposed on an insulator is provided and includes forming first and second nanowire channels connected at each end to semiconductor pads at first and second wafer regions, respectively, with first nanowire channel sidewalls characterized with a first alignment degree relative to a crystallographic plane of the semiconductor and second nanowire channel sidewalls characterized with a second alignment degree relative to the crystallographic plane, which is different from the first alignment degree and encouraging displacement of semiconductor material from the first and second nanowire channels toward an alignment condition between the sidewalls and the crystallographic plane such that thickness differences between the first and second nanowire channels after the displacement are in accordance with the first and second alignment degree difference.

In accordance with an aspect of the invention, a method of modifying a wafer having a semiconductor disposed on an insulator is provided and includes forming, in a first region of the wafer, pairs of semiconductor pads connected by nanowire channels having long axes thereof oriented in the {110} crystallographic planes of the semiconductor and sidewalls substantially parallel to one of the {110} planes of the semiconductor, forming, in a second region of the wafer, pairs of semiconductor pads connected by nanowire channels having long axes thereof at an angle with respect to the {110} crystallographic planes of the semiconductor and sidewalls similarly angled with respect to the {110} planes of the semiconductor and reorienting the nanowires channels of the second region to form sidewalls parallel to the {110} planes of the semiconductor by diffusion of semiconductor material from the nanowires channels to the pads such that the nanowire channels in the second region are thinned as compared to those at the first region.

In accordance with another aspect of the invention, a wafer is provided and includes a substrate, a buried oxide (BOX) layer disposed on the substrate and a silicon-on-insulator (SOI) structure disposed on the BOX layer at first and second regions, the SOI structure at each region having respective pairs of SOI pads connected via respective nanowire channels formed therein, the SOI pads and the nanowire channels at one of the regions being more misaligned with respect to {110} planes of the SOI than the SOI pads and the nanowire channels at the other of the regions.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Structures to support, for example, gate-all-around (GAA) nanowire field effect transistors (FETs) as well as methods for fabricating the same are provided by way of descriptions referring to silicon (Si) nanowires and Si processing. However, the present techniques can also be practiced with other semiconductor materials such as, for example, germanium (Ge). When non-Si-containing semiconductors are used, the processing steps of the present teachings are similar and adapted to the specific semiconductor used. Use of Si-containing semiconductor materials such as Si, silicon germanium (SiGe), Si/SiGe, silicon carbide (SiC) or silicon germanium carbide (SiGeC) are therefore understood to be merely exemplary.

Figure 1:
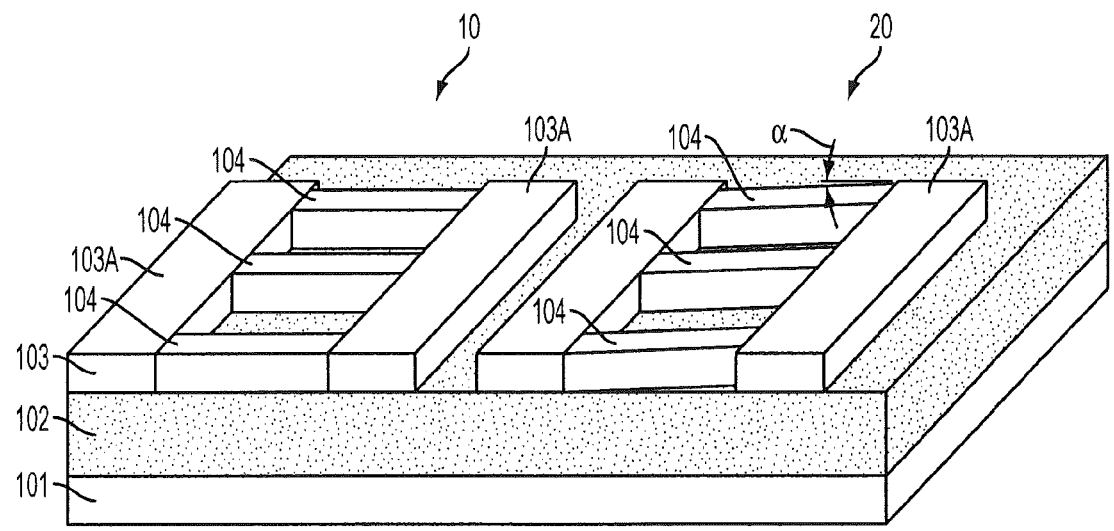
FIG. 1 is a perspective view of the wafer of FIG. 1 having nanowire channels defined thereon at first and second regions.
Figure 2:
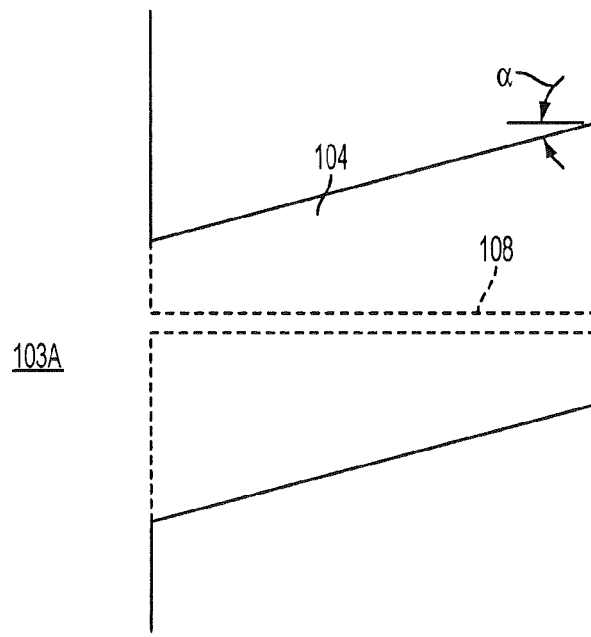
FIG. 2 is a plan view of a dimension of the nanowire channels of FIG. 1.

With reference to FIGS. 1 and 2, a wafer 1 is provided and includes a Si substrate 101, a buried oxide (BOX) layer 102 and a silicon-on-insulator (SOI) layer 103. The wafer 1 can be fabricated using methods such as Separation by IMplanted OXygen (SIMOX) or wafer bonding (for example, Smart-Cut™). These wafer fabrication techniques are known to those of skill in the art and thus are not described further herein. Also, the substitution of other SOI substrates known in the art for the SOI on BOX configuration described herein may be made and would be within the scope of the present teachings.

The wafer 1 has at least a first region 10 and a second region 20 established thereon. Pairs of SOI pads 103A and nanowire channels 104 connecting them can be patterned into the SOI layer 103 at the first region 10 and the second region 20 to form, for example, ladder-like structures in each region. The patterning of the nanowire channels 104 and SOI pads 103A may be achieved by lithography (e.g., optical or e-beam) followed by reactive ion etching (RIE) or by sidewall transfer techniques. These patterning techniques are known to those of skill in the art.

The SOI layers 103 at the first and second regions 10 and 20 are each initially formed of similar components with similar thicknesses. However, as shown in FIGS. 1 and 2, the SOI pads 103A and the nanowire channels 104 at the first region 10 are formed to have sidewalls that are substantially parallel and/or aligned with, for example, one of the {110} crystallographic planes of the semiconductor, although other planar reference frames are possible. That is, the main (long) axis of each of the nanowire channels 104 is oriented in the direction of the {110} crystallographic planes of the semiconductor. On the other hand, the SOI pads 103A and the nanowire channels 104 at the second region 20 are formed to have sidewalls that are angled and/or misaligned by angle, α, with respect to the {110} crystallographic plane, with the main (long) axis of the nanowires channels 104 also misaligned by angle, α, with respect to the {110} crystallographic plane. For example, nanowires channels 104 in first region 10 can be patterned to have sidewalls parallel to {110} planes and top face parallel to the {100} planes whereas nanowires channels 104 in second region 20 will have sidewalls that are misaligned by an angle, such as α=1 degree, with respect to the {110} crystallographic plane, and top faces that are parallel to the {100} planes.

With the second region 20 nanowire channels 104 angled and/or misaligned, as described above, a thinning operation, such as an anneal of the nanowire channels 104, which is conducted with respect to both the first and the second regions 10 and 20 will tend to have a greater thinning effect at the second region 20 than at the first region 10. This is due to the fact that the offset crystallographic orientation of the SOI layer 103 at the second region 20 leaves the SOI layer 103 at the second region 20 more susceptible to the effects of thinning operations than that of the first region 10. The thinning operation tends to reorient the nanowires channels 104 of the second region 20 to form sidewalls parallel to the {110} crystallographic planes by diffusion of semiconductor material from the nanowire channels 104 to the SOI pads 103A. This has the effect of the nanowire channels 104 in the second region 20 becoming thinner than those at the first region 10 after reorientation.

The degree by which the SOI layer 103 of the second region 20 is thinned more than that of the first region 10 can be controlled by increasing or decreasing relative misalignments of the sidewalls of the first and second regions 10 and 20. For example, the nanowire channel 104 sidewalls at the first region 10 may be aligned with respect to the {110} crystallographic plane of the semiconductor or misaligned by only a small angle, α. Meanwhile, the nanowire channel 104 sidewalls at the second region 20 may be intentionally misaligned with respect to the {110} crystallographic plane of the semiconductor by a relatively large angle, α. Here, the greater the relative misalignments of the sidewalls of the first and second regions 10 and 20, the greater the degree of thinning at the second region 20.

Indeed, with reference to FIG. 2, the angle α of the nanowire channel 104 with respect to the {110} crystallographic plane can be any angle that is less than 45° (and in practice a does not exceed a few degrees) with the understanding that the greater the obliqueness of the angle the more thin the resulting reshaped nanowire 108 will be. That is, a more obliquely angled nanowire channel 104 will tend to form a thinner reshaped nanowire 108 than a more perpendicular nanowire channel 104. Thus, while the dimensions of the nanowire channel 104 and its obliqueness may be varied in accordance with design considerations, a profile of the nanowire channel 104 should encompass at least a profile of the reshaped nanowire 108 that is desired to be formed.

The reorientation process where silicon diffuses from the nanowire channels 104 is described more fully in G. M. Cohen et al., "Controlling the shape and dimensional variability of top-down fabricated silicon nanowires by hydrogen annealing", Material Research Symposium, San Francisco, Calif., (2010), the contents of which are incorporated herein by reference. The specification for crystal plane directions follows the Miller indices convention, which is described in, e.g., Ashcroft and Mermin, Solid State Physics, chapter 5 (1976), the contents of which are incorporated herein by reference. Following this convention a family of crystal planes, i.e. planes that are equivalent by the virtue of the symmetry of the crystal is typically referenced by a pair of { } parentheses. For example, the planes (100), (010) and (001) are all equivalent in a cubic crystal. One refers to them collectively as {100} planes. When directions in a crystal are referenced [ ] brackets are used, e.g. [100], [010], [001], [-100], [0-10],[00-1], and similarly a family of crystal direction are referred to collectively as <100>.

The nanowire channels 104 at the second region 20 can therefore be formed into reshaped nanowires 108 (see FIG. 3) that are thinner than those of the first region 10 even where an anneal process is conducted in a similar manner at each region. In particular, the reshaped nanowires 108 of the first region 10 will have a thickness $T_{1'}$, and reshaped nanowires 108 of the second region 20 will have a thickness $T_{2'}$ that will be different from and generally thinner than the thickness $T_{1'}$. These differences in the relative thicknesses of the reshaped nanowires 108 at the first and second regions 10 and 20 will, accordingly, lead to the reshaped nanowires 108 exhibiting physical characteristics that may be unique from one another.

The angling of the nanowire channels 104 can be accomplished in various manners. For example, a lithography mask may include as-drawn aligned and misaligned patterns for regions 10 and regions 20, or alternatively during the patterning of the angled nanowire channels 104, the wafer 1 or a patterning mask may be rotated with respect to the {110} crystallographic planes. The angling of the nanowire channels 104 need not be in any particular crystallographic plane, however, and the above-described {110} crystallographic plane is understood to be merely exemplary.

Figure 3:
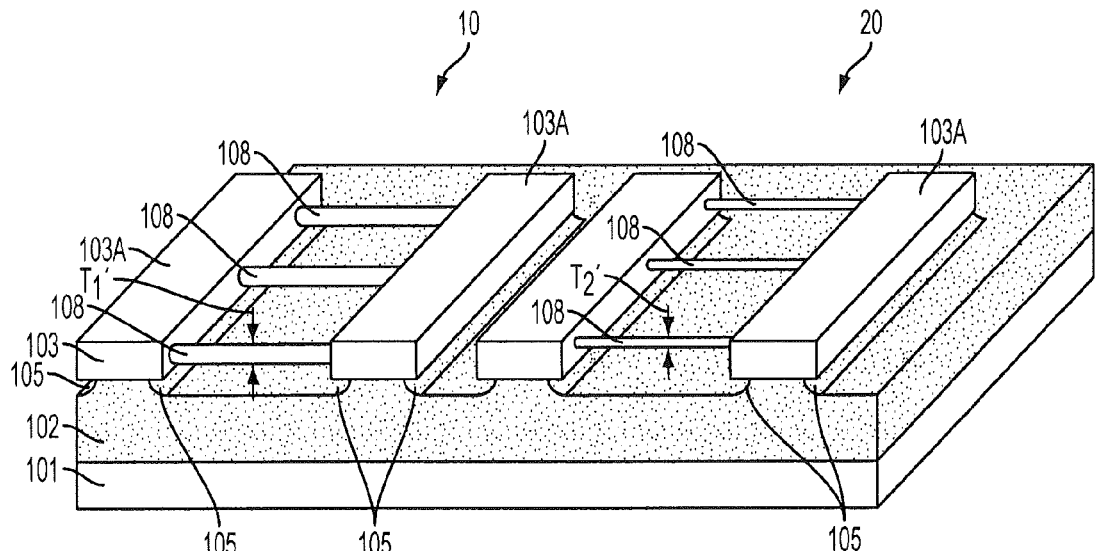
FIG. 3 is a perspective view of the wafer of FIG. 1 having reshaped nanowires defined thereon.

With reference to FIG. 3, the reshaping of the nanowire channels 104 into nanowires 108 is typically accomplished by annealing in an inert gas. This may be a maskless process that is simultaneously or sequentially applied to regions 10 and 20.

As an example, the wafer 1 may be annealed in an exemplary $H_2$ gas. Shortly before this $H_2$ annealing, native oxide may be etched off sidewalls of the nanowire channels 104 and the SOI pads 103A. The annealing in $H_2$ has several goals including, but not limited to, smoothing the sidewalls of the nanowire channels 104, realigning the sidewalls to the crystallographic planes of the SOI pads 103A, re-shaping the nanowire channel 104 cross-sections from rectangular shapes to more cylindrical shapes and thinning of the nanowire channel 104 bodies by way of a re-distribution of Si.

According to an exemplary embodiment, the inert gas anneal is performed with a gas pressure of from about 30 torr to about 1000 torr, at a temperature of from about 600 degrees Celsius (° C.) to about 1100° C. and for a duration of from about one minute to about 120 minutes. In general, the rate of Si re-distribution increases with temperature and decrease with an increase in pressure.

As shown in FIG. 3, the nanowire channels 104 can be reshaped into nanowires 108 and suspended or released from the BOX layer 102 by the annealing process or by a further etching and recessing of the BOX layer 102. The reshaped nanowires 108 thus form suspended bridges between SOI pads 103A and over recessed oxide 105 in the first and second regions 10 and 20. The recessing of the BOX layer 102 can be achieved either as a result of the annealing process or with a diluted hydrofluoric (DHF) etch to undercut the BOX layer 102. While SOI substrates provide an easy path to define and suspend nanowire channels 104 and/or reshaped nanowires 108, it is possible to obtain suspension with other substrates. For example, a SiGe/Si stack epitaxially grown on bulk Si wafers can also be patterned to form the nanowire channels 104 and/or the reshaped nanowires 108. An SiGe layer can also be used as a sacrificial layer (analogous to the BOX layer 102) which is undercut.

The reshaped nanowires 108 at the first region 10 and having a thickness $T_{1'}$ and the reshaped nanowires 108 at the second region 20 and having a thickness $T_{2'}$ may have different drive currents and/or threshold voltages. In this way, it is understood that circuit characteristics at least at the first and second regions 10 and 20 of the wafer 1 can be controlled by corresponding control of the angling of the nanowire channels 104 at the first and second regions 10 and 20 which are partially determinative of the final thicknesses $T_{1'}$ and $T_{2'}$.

Figure 4:
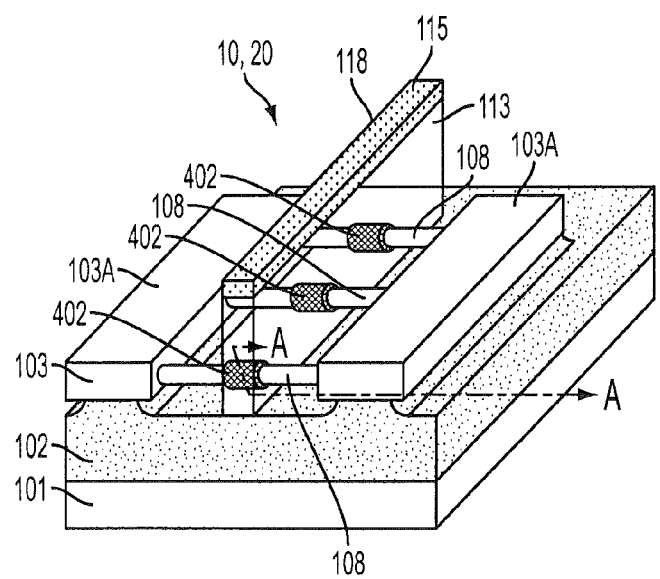
FIG. 4 is a perspective view of a reshaped nanowire having a gate structure.
Figure 5:
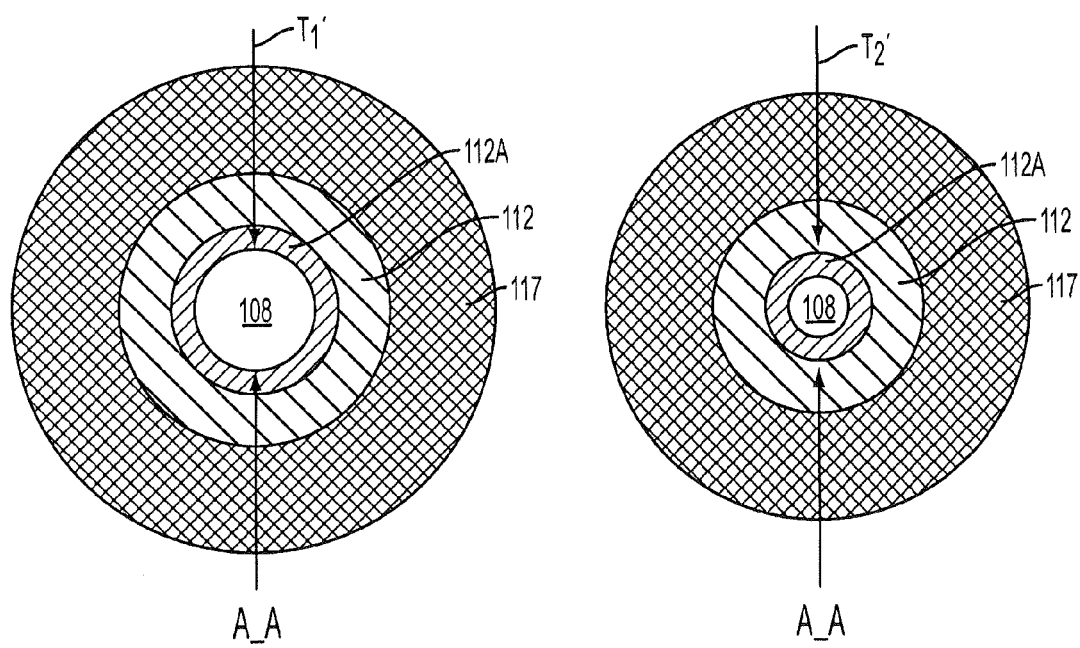
FIG. 5 includes cross-sectional views of nanowires having different thicknesses.

Referring now to FIGS. 4 and 5, a gate structure 402 may be formed around the reshaped nanowires 108. First, the reshaped nanowires 108 are coated with first and second gate dielectrics 112A and 112. The first (and optional) gate dielectric 112A is typically $SiO_2$. The second gate dielectric 112 may include silicon dioxide ($SiO_2$), silicon oxynitride (SiON), hafnium oxide ($HfO_2$) or any other suitable high-k dielectric(s) and may be deposited using chemical vapor deposition (CVD), atomic layer deposition (ALD) or an oxidation furnace in the case of $SiO_2$ and SiON. A conformal deposition of a thin gate conductor 117 of, e.g., TaN or TiN, may then be formed. This may be followed by a deposition of doped poly-Si 113 to form a gate stack 118 perimetrically surrounding the reshaped nanowires 108. A mask 115 is employed to facilitate the etching of a gate line by, for example, RIE. A portion of the thin gate conductor 117 outside of the gate stack 118 may be removed by RIE or, in an alternate embodiment, the removal of the thin gate conductor 117 from surfaces outside gate stack may require an additional wet etch operation.

Poly-germanium or another suitable composition can be used as a substitute to poly-Si 113. Additionally, any poly-SiGe alloy can also be used to substitute poly-Si 113. Still further, poly-Si 113 can be deposited in a poly-crystalline form or deposited in an amorphous form which is later transformed into poly-Si when exposed to high temperature.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A method of modifying a wafer having a semiconductor disposed on an insulator, the method comprising:
   forming first and second nanowire channels connected at each end to semiconductor pads at first and second wafer regions, respectively, with second nanowire channel sidewalls being misaligned relative to a crystallographic plane of the semiconductor to a greater degree than first nanowire channel sidewalls; and
   displacing semiconductor material from the first and second nanowire channels toward an alignment condition between the sidewalls thereof and the crystallographic plane to form first and second nanowires, respectively,
   the displacing being executed such that a thickness difference between the second nanowire and the second nanowire channel exceeds a thickness difference between the first nanowire and the first nanowire channel in accordance with the greater degree of the misalignment of the second nanowire channel sidewalls as compared to that of the first nanowire channel sidewalls.

2. The method according to claim 1, wherein the forming comprises forming the nanowire channels of the first region in parallel with one another and forming the nanowire channels of the second region in parallel with one another.

3. The method according to claim 1, wherein the first nanowire channel sidewalls are aligned with respect to the crystallographic plane and the second nanowire channel sidewalls are misaligned with respect to the crystallographic plane.

4. The method according to claim 1, wherein the first and second nanowire channel sidewalls are both misaligned with respect to the crystallographic plane.

5. The method according to claim 1, wherein the displacing of the semiconductor material comprises annealing.

6. The method according to claim 1, further comprising reshaping the nanowire channels into nanowires.

7. The method according to claim 6, further comprising forming a respective gate surrounding each of the nanowires.

8. The method according to claim 7, wherein the gates each comprise a dielectric, a thin gate conductor and doped conductive material.

9. The method according to claim 7, wherein the nanowires each have respective drive currents and/or threshold voltages that differ in accordance with the differences between the thicknesses of the first and second nanowires.

10. The method according to claim 1, wherein the forming comprises a patterning process.

11. A method of modifying a wafer having a semiconductor disposed on an insulator, the method comprising:
    forming first and second nanowire channels connected at each end to semiconductor pads at first and second wafer regions, respectively, with first nanowire channel sidewalls characterized with a first alignment degree relative to a crystallographic plane of the semiconductor and second nanowire channel sidewalls characterized with a second alignment degree relative to the crystallographic plane, which is different from the first alignment degree; and encouraging displacement of semiconductor material from the first and second nanowire channels toward an alignment condition between the sidewalls and the crystallographic plane to form first and second nanowires, respectively, the encouraging being executed such that a thickness difference between the second nanowire and the second nanowire channel exceeds a thickness difference between the first nanowire and the first nanowire channel in accordance with the greater degree of the misalignment of the second nanowire channel sidewalls as compared to that of the first nanowire channel sidewalls.

12. A method of modifying a wafer having a semiconductor disposed on an insulator, the method comprising:

forming, in a first region of the wafer, pairs of semiconductor pads connected by nanowire channels having long axes thereof oriented in the {110} crystallographic planes of the semiconductor and sidewalls substantially parallel to one of the {110} planes of the semiconductor;

forming, in a second region of the wafer, pairs of semiconductor pads connected by nanowire channels having long axes thereof at an angle with respect to the {110} crystallographic planes of the semiconductor and sidewalls similarly angled with respect to the {110} planes of the semiconductor; and transforming the nanowire channels of the first and second region into first and second nanowires, respectively, the second nanowire being reoriented relative to the nanowire channel of the second region with sidewalls parallel to the {110} planes of the semiconductor, the transforming being executed by diffusion of semiconductor material from the nanowire channels to the pads, wherein the second nanowire is thinned relative to the nanowire channel of the second region more than the first nanowire is thinned relative to the nanowire channel of the first region in accordance with a magnitude of the angle.

13. The method according to claim 12, further comprising reshaping the nanowire channels into nanowires.

14. The method according to claim 13, further comprising forming a respective gate surrounding each of the nanowires.

15. The method according to claim 14, wherein the gates each comprise a dielectric, a thin gate conductor and doped conductive material.

16. The method according to claim 14, wherein the nanowires each have respective drive currents and/or threshold voltages that differ in accordance with the differences between the thicknesses of the first and second nanowires.

17. The method according to claim 12, wherein the forming comprises a patterning process.

* * * * *